(12) United States Patent
Suto

(10) Patent No.: US 9,804,921 B2
(45) Date of Patent: Oct. 31, 2017

(54) NONVOLATILE MEMORY APPARATUS AND CONTROL METHOD OF NONVOLATILE MEMORY APPARATUS

(71) Applicant: Panasonic Intellectual Property Management Co., Ltd., Osaka (JP)

(72) Inventor: Masato Suto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 52 days.

(21) Appl. No.: 14/968,830

(22) Filed: Dec. 14, 2015

(65) Prior Publication Data

US 2016/0179613 A1  Jun. 23, 2016

(30) Foreign Application Priority Data

Dec. 18, 2014 (JP) .................................. 2014-256386

(51) Int. Cl.
*G11C 29/00* (2006.01)
*G06F 11/10* (2006.01)
*H03M 13/05* (2006.01)

(52) U.S. Cl.
CPC ......... *G06F 11/1048* (2013.01); *H03M 13/05* (2013.01)

(58) Field of Classification Search
CPC ........................... G06F 11/1048; H03M 13/05
See application file for complete search history.

(56) References Cited

U.S. PATENT DOCUMENTS

| 2010/0313084 | A1 | 12/2010 | Hida et al. | |
|---|---|---|---|---|
| 2012/0030528 | A1 | 2/2012 | Hida et al. | |
| 2012/0239992 | A1 | 9/2012 | Hida et al. | |
| 2013/0346805 | A1* | 12/2013 | Sprouse ............. | G11C 16/3418 714/42 |
| 2014/0040664 | A1 | 2/2014 | Hida et al. | |
| 2014/0304567 | A1 | 10/2014 | Hida et al. | |
| 2015/0268871 | A1* | 9/2015 | Shu ....................... | G06F 3/0616 711/103 |

FOREIGN PATENT DOCUMENTS

| JP | 2009-205578 A | 9/2009 |
|---|---|---|
| JP | 2010-086404 A | 4/2010 |
| JP | 2013-125303 A | 6/2013 |

* cited by examiner

*Primary Examiner* — Sam Rizk
(74) *Attorney, Agent, or Firm* — McDermott Will & Emery LLP

(57) ABSTRACT

A nonvolatile memory apparatus is provided with a nonvolatile memory including a plurality of blocks each being a recording area of the data and a unit of erasing of the data, and a controller for controlling writing or reading of the data to/from the nonvolatile memory. Each of the blocks includes pages each being a unit of reading of the data. The controller, when data of a first page is read in response to the data read request from the external apparatus, reads data of an other page other than the first page in a block from which the data is read, and calculates a number of errors of the data in the other page, and rewrites the data into an other block when the block from which the data is read satisfies a predetermined condition on the error based on the calculated number of errors.

8 Claims, 9 Drawing Sheets

REFRESH TARGET AREA INFORMATION

| SEQUENCE NUMBER | STATUS OF USE | COPY SOURCE BLOCK ADDRESS | COPY DESTINATION BLOCK ADDRESS | NUMBER OF COPIED PAGES |
|---|---|---|---|---|
| 1 | VALID | 501 | 603 | 32 |
| 2 | VALID | 203 | 351 | 0 |
| 3 | INVALID | - | - | - |
| 4 | INVALID | - | - | - |

NONVOLATILE MEMORY APPARATUS AND CONTROL METHOD OF NONVOLATILE MEMORY APPARATUS

BACKGROUND

Related Applications

This application claims the benefit of Japanese Patent Application No. 2014-256386 filed on Dec. 18, 2014, the disclosure of which application is incorporated by reference herein.

1. Technical Field

The present disclosure relates to a nonvolatile memory apparatus capable of writing, reading data, and a control method of the nonvolatile memory apparatus.

2. Description of the Related Art

Unexamined Japanese Patent Publication No. 2009-205578 discloses a refresh method of a nonvolatile memory apparatus capable of recording data to a block being a unit of erasing of the data. In the refresh method disclosed in Unexamined Japanese Patent Publication No. 2009-205578, when a number of errors of data of one block is equal to or greater than a predetermined threshold, refresh is performed by rewriting the data of the block to the other block to restore the error. Thus, efficient refresh processing has been realized.

SUMMARY

In a first aspect of the present disclosure, a nonvolatile memory apparatus is provided for writing or reading data in response to a write or read request of the data from an external apparatus. The nonvolatile memory apparatus is provided with a nonvolatile memory including a plurality of blocks each being a recording area of the data and a unit of erasing of the data, and a controller for controlling writing or reading of the data to the nonvolatile memory. Each of the blocks includes a plurality of pages each being a unit of reading of the data. The controller, when data of a first page is read in response to the data read request from the external apparatus, reads data of an other page other than the first page in a block from which the data is read, and calculates a number of errors of the data in the other page, and rewrites the data of the block into an other block when the block from which the data is read satisfies a predetermined condition on the error based on the calculated number of errors.

In a second aspect of the present disclosure, a control method of a nonvolatile memory apparatus is provided for writing or reading data in response to a write or read request of the data from an external apparatus. The nonvolatile memory apparatus includes a plurality of blocks each being a recording area of the data and a unit of erasing of the data, and each of the blocks includes a plurality of pages each being a unit of reading of the data. The control method reads data of a first page in response to the data read request from the external apparatus, and reads data of an other page other than the first page in a block from which the data is read, and calculates the number of errors of data in the other page, and rewrites the data of the block into the other block when the block from which the data is read satisfies a predetermined condition on the error based on the calculated number of errors.

DETAILED DESCRIPTION

Exemplary embodiments are described below with appropriate reference to drawings. However, an unnecessarily detailed description may be omitted. For example, a detailed description of an already well known matter and a duplicate description for substantially the same configuration may be omitted. This is to avoid the description below is unnecessarily redundant, and to facilitate understanding of those skilled in the art.

Incidentally, accompanying drawings and the description below are provided so that those skilled in the art sufficiently understand the present disclosure, and are not intended to limit the claimed subject matter.

First Exemplary Embodiment

A first exemplary embodiment will be described below with reference to FIG. 1 to FIG. 8.

[1-1. Configuration]

[1-1-1. Configuration of Nonvolatile Memory Apparatus]

Figure 1:
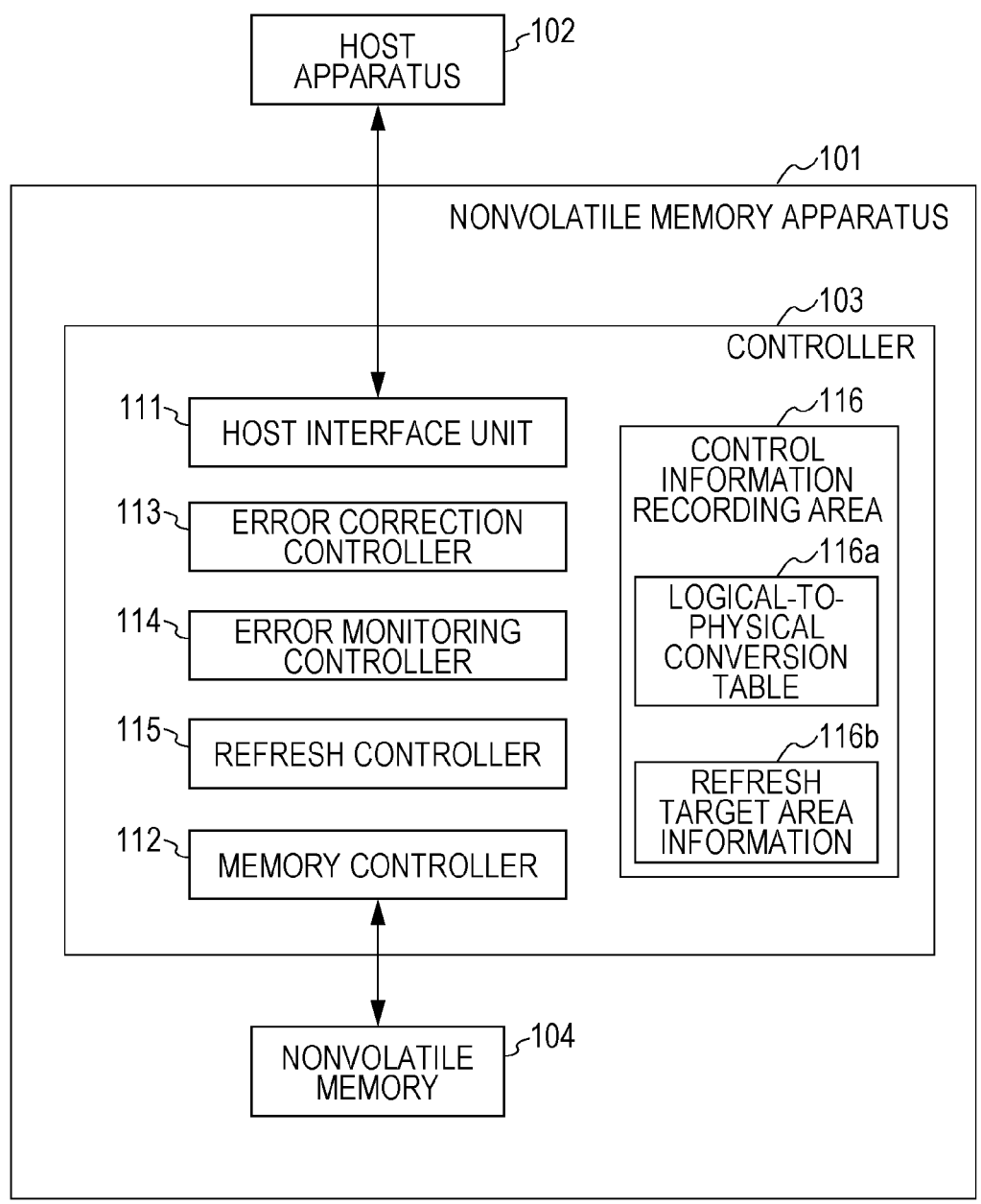
FIG. 1 is a block diagram illustrating a configuration of a system provided with a nonvolatile memory apparatus and a host apparatus in an exemplary embodiment.

FIG. 1 is a block diagram illustrating an entire configuration of a memory system configured of a nonvolatile memory apparatus and a host apparatus in the present exemplary embodiment.

Nonvolatile memory apparatus 101 is a memory card such as CompactFlash®, an SD memory card. Otherwise, nonvolatile memory apparatus 101 can be a flash drive, an embedded memory device, an SSD (Solid State Drive). Nonvolatile memory apparatus 101 is provided with controller 103 and nonvolatile memory 104. Nonvolatile memory apparatus 101 is able to store digital data of various contents such as a moving image, still image, voice, text (hereinafter referred to as "content data"). Nonvolatile memory apparatus 101 can be connected to host apparatus 102.

Host apparatus 102 is an apparatus for recording the content data to nonvolatile memory apparatus 101, and for reading the content data from nonvolatile memory apparatus 101. Host apparatus 102 is, for example, a digital camera, personal computer, smartphone, tablet terminal.

Controller 103 is configured of a semiconductor circuit for receiving a command from host apparatus 102 to control writing and reading of the content data to nonvolatile memory 104. The semiconductor circuit can be configured of only a hardware configuration to realize a predetermined function, or configured to realize the predetermined function in cooperation with software (program). For example, the semiconductor circuit is configured of an ASIC, FPGA, CPU, MPU, microprocessor. Controller 103 is provided with host interface unit 111, memory controller 112, error correction controller 113, error monitoring controller 114, refresh controller 115, and control information recording area 116.

Nonvolatile memory 104 is a recording medium (recording element) capable of holding the content data even when there is no power supply. Nonvolatile memory 104 can be configured of a NAND flash memory, for example.

In controller 103, host interface unit 111 transmits/receives commands and the content data to/from host apparatus 102. Memory controller 112 controls writing, reading, erasing of the content data to nonvolatile memory 104. Error correction controller 113 restores an error that occurs in the content data written in nonvolatile memory 104. Error monitoring controller 114 monitors an increase in the error of the content data written in nonvolatile memory 104. Refresh controller 115 performs error correction of the content data and restoring (hereinafter, refresh processing) by rewriting when the error of the content data written in nonvolatile memory 104 is increased.

Control information recording area 116 is a recording area for storing logical-to-physical conversion table 116a and refresh target area information 116b. Logical-to-physical conversion table 116a stores information indicating a correspondence between a logical address used by host apparatus 102 and a physical address of nonvolatile memory 104. Refresh target area information 116b stores address information and the like used for performing refresh processing. In addition, control information recording area 116 can be provided on nonvolatile memory 104 instead of controller 103.

[1-1-2. Configuration of Nonvolatile Memory]

Figure 2:
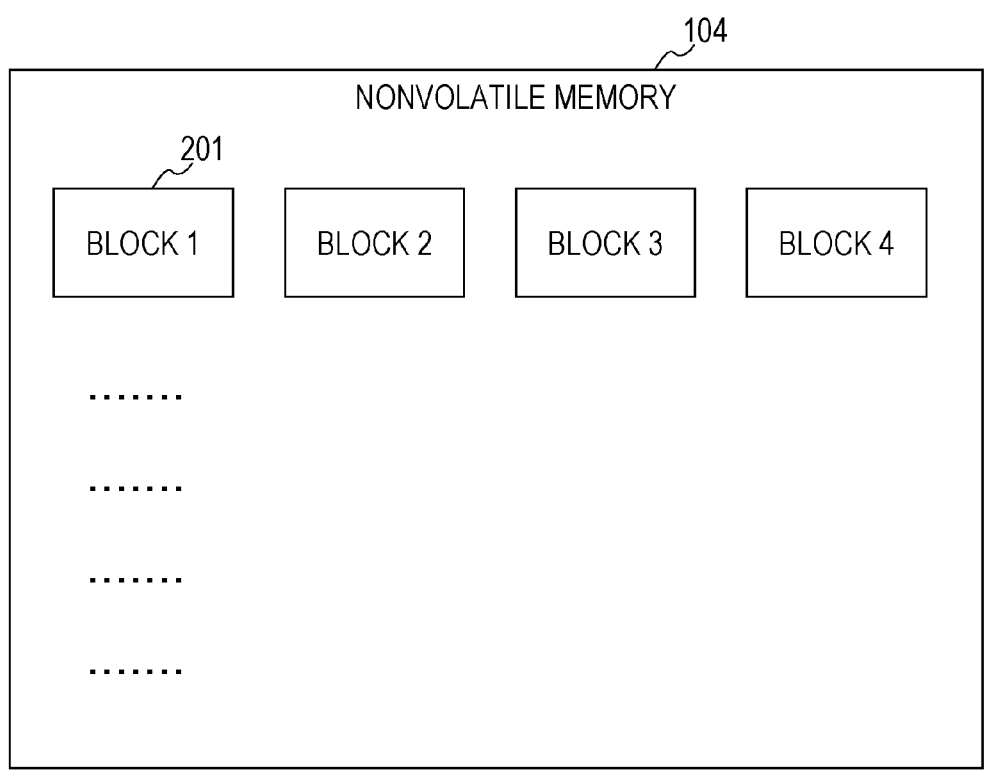
FIG. 2 is a diagram illustrating a configuration of a recording area (block) of a nonvolatile memory.

FIG. 2 is a diagram illustrating a configuration of a recording area (block) of nonvolatile memory 104 in the present exemplary embodiment.

Nonvolatile memory 104 is configured of a plurality of blocks 201. Each of blocks 201 is a unit of erasing, and the data is erased by the unit.

[1-1-3. Configuration of Block]

Figure 3:
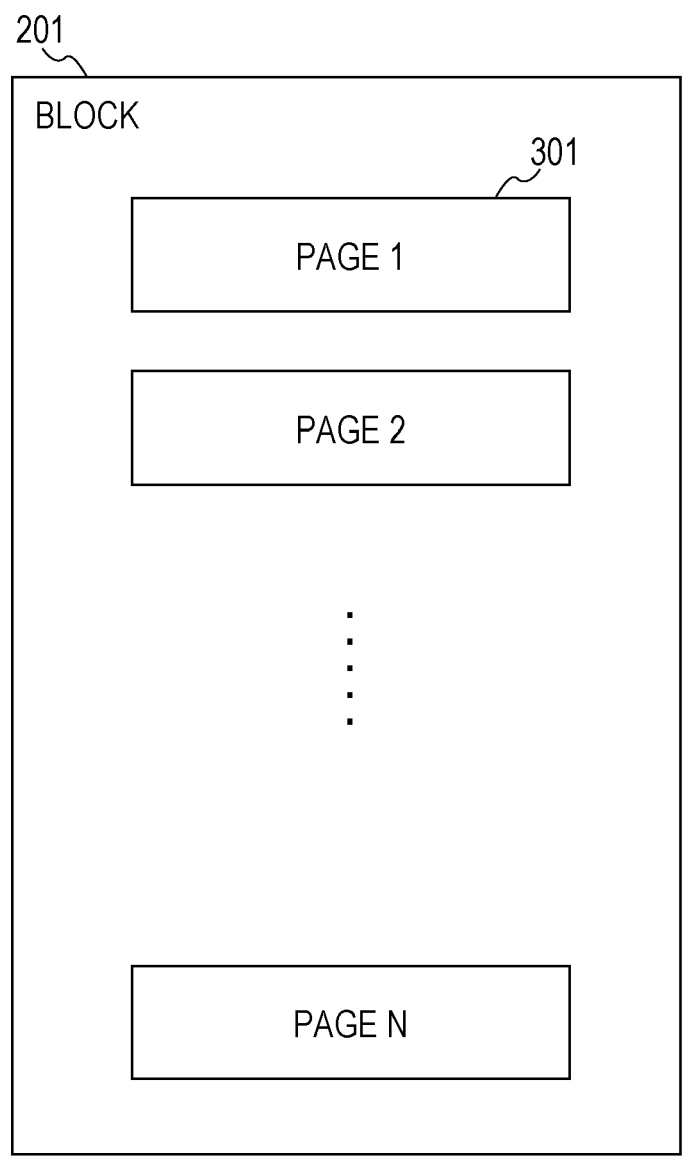
FIG. 3 is a schematic diagram illustrating a configuration of the block in the nonvolatile memory.

FIG. 3 is a schematic diagram illustrating a configuration of each of blocks 201 in the present exemplary embodiment. Each of blocks 201 is configured of a plurality of pages 301. In the present exemplary embodiment, a number of pages is N. The page is a unit of writing and reading. When the data is written in nonvolatile memory 104, the data is erased by a block and then written in order from a page numbered small, in the block.

[1-1-4. Configuration of Page]

Figures 4, 5:
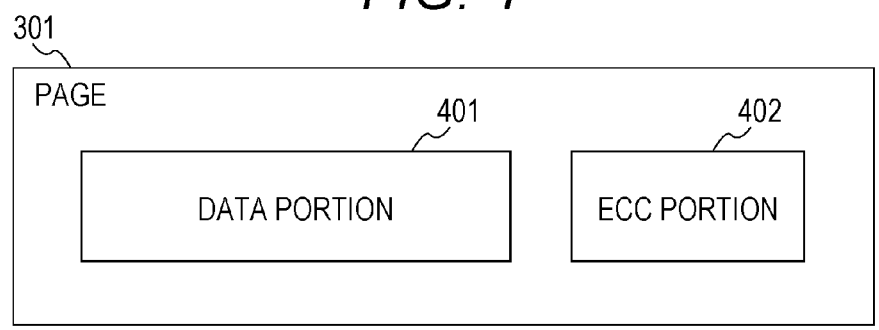
FIG. 4 is a schematic diagram illustrating a configuration of a page in the nonvolatile memory.
FIG. 5 is a diagram illustrating a configuration of refresh target area information.

FIG. 4 is a schematic diagram illustrating a configuration of each of pages 301 in the present exemplary embodiment. Each of pages 301 is configured of data portion 401 and ECC portion 402. Data portion 401 is an area for storing the content data transmitted from host apparatus 102. ECC portion 402 is an area for storing an error correction code to the content data stored in data portion 401. Error correction controller 113 in controller 103 is able to calculate a number of error bits and an error bit position of the data stored in data portion 401, based on the error correction code stored in ECC portion 402. Thus, it becomes possible to correct the error bit of the data stored in data portion 401.

[1-1-5. Configuration of Refresh Target Area Information]

FIG. 5 is a diagram illustrating a configuration of refresh target area information 116b. Refresh target area information 116b is configured of a plurality of pieces of refresh information (entry). Each of the pieces of the refresh information is configured of sequence number 500, status of use 501 of the refresh information, copy source block address 502, copy destination block address 503, and number of copied pages 504.

Sequence number 500 is sequentially assigned in order in which the refresh information is recorded. Status of use 501 of the refresh information includes information indicating whether the refresh information is "valid" or "invalid." Copy source block address 502 indicates an address of a block of a rewrite source in the refresh processing. That is, copy source block address 502 indicates a physical address of a block in which the number of error bits is included equal to or greater than a predetermined value.

Copy destination block address 503 indicates a rewrite destination address in the refresh processing. More specifically, copy destination block address 503 indicates a physical address of a block of a copy destination in which data of the block indicated by copy source block address 502 is copied by a page to restore. Number of copied pages 504 indicates the number of pages to which the refresh processing has been performed, namely, the number of pages copied to the block indicated by copy destination block address 503 in the block indicated by copy source block address 502.

[1-2. Operation]

Operation of nonvolatile memory apparatus 101 configured as the above will be described below.

[1-2-1. Operation During Data Writing]

Figure 6:
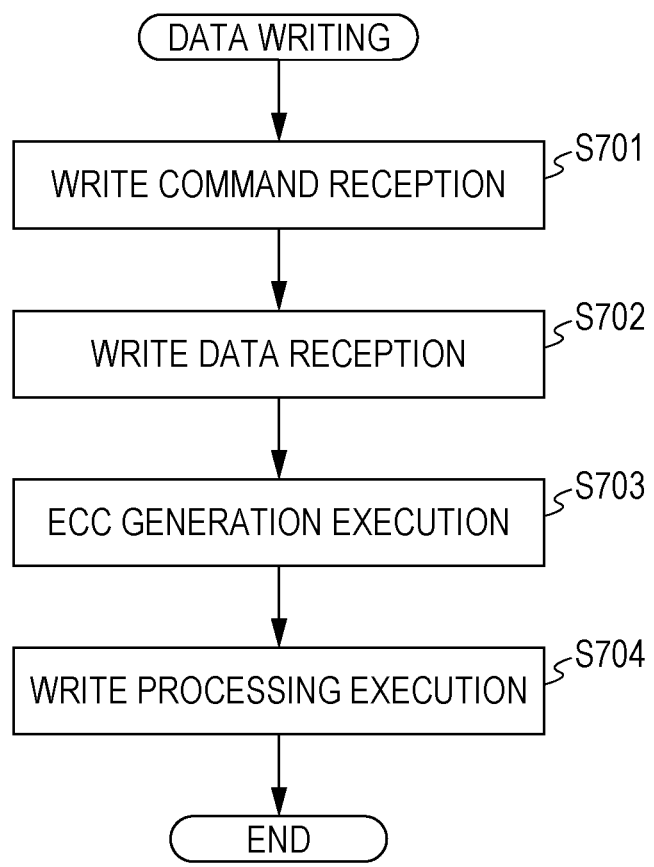
FIG. 6 is a flowchart illustrating operation during data writing in the nonvolatile memory apparatus.

First, write operation of data to nonvolatile memory apparatus 101 will be described. FIG. 6 is a flowchart illustrating operation of nonvolatile memory apparatus 101 during data writing.

When host apparatus 102 writes the content data into nonvolatile memory apparatus 101, host apparatus 102 transmits a write command and a write address to nonvolatile memory apparatus 101. In nonvolatile memory apparatus 101, host interface unit 111 receives the write command and the write address (S701).

Then, host apparatus 102 transmits the content data to nonvolatile memory apparatus 101. Host interface unit 111 receives the content data from host apparatus 102 (S702).

In nonvolatile memory apparatus 101, error correction controller 113 generates an error correction code to the received content data (S703).

Memory controller 112 determines a block (physical block) and a page of a write destination corresponding to the received write address (logical address), and writes the content data and the generated error correction code to the determined page of the write destination block (S704), and ends data write processing.

Incidentally, in the data write processing, memory controller 112 records a correspondence relationship between the received write address (logical address) and the block of the write destination of the data (address of a logical block) in logical-to-physical conversion table 116a. Memory controller 112, when receiving a read command from host apparatus 102, determines a block of a read destination in nonvolatile memory 104 corresponding to a read address designated by host apparatus 102 with reference to the logical-to-physical conversion table 116a, and reads data from the determined block of the read destination.

[1-2-2. Occurrence of Error During Data Reading]

Figure 7:
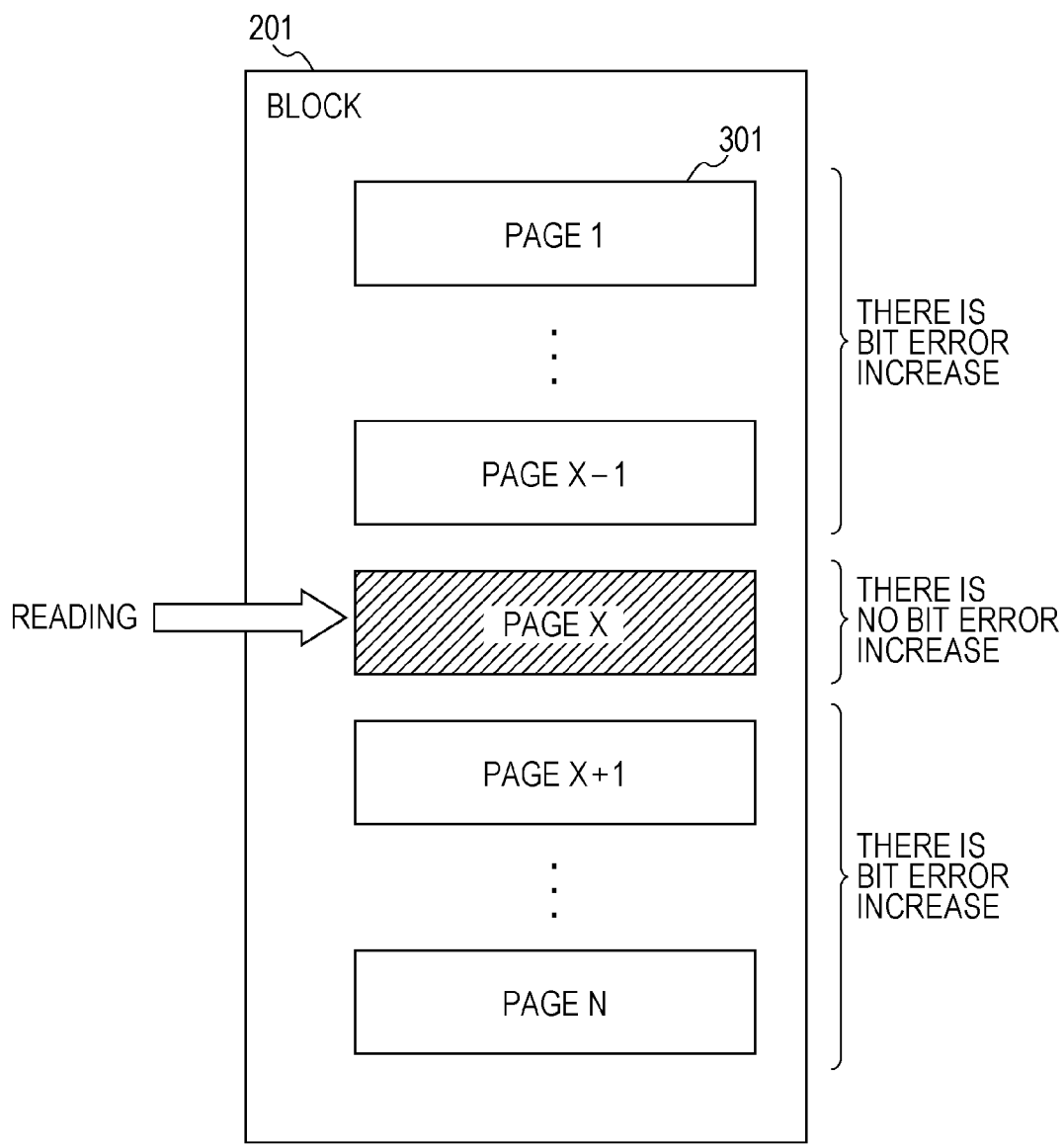
FIG. 7 is an explanatory diagram for describing a range of a bit error that occurs during data reading.

An error of data (bit) that occurs during data reading will be described. FIG. 7 is a diagram for describing a range of a data error that occurs during data reading from nonvolatile memory 104.

In an nonvolatile memory such as the NAND flash memory, when the data is read from page X in blocks 201, the error of the data does not occur (increase) in page X to be read. However, in pages other than page X to be read, the error of the data occurs (increases). The error of the data is typically corrected by error correction controller 113 using the error correction code stored in ECC portion 402. However, if page X is repeatedly read, the error of the data in the pages other than page X gradually increases. Then, if the number of errors of the data exceeds error correction capability, it becomes impossible to restore the data correctly even when the error correction code is used. In this case, since the error of page X does not increase, the error in the other page cannot be detected even if the number of error bits of page X is monitored when page X is read. That is, it is impossible to detect that the error of the other page is about to exceed the error correction capability.

Therefore, nonvolatile memory apparatus 101 of the present exemplary embodiment manages a block including the number of error bits equal to or greater than a predetermined number as a refresh target area, and shifts the data of the block to the other block when the number of error bits exceeds a threshold. Thus, before the number of errors of the data exceeds the error correction capability, it is possible to reset the number of errors, and to prevent that error correction of the data becomes impossible.

[1-2-3. Operation During Data Reading]

Figure 8:
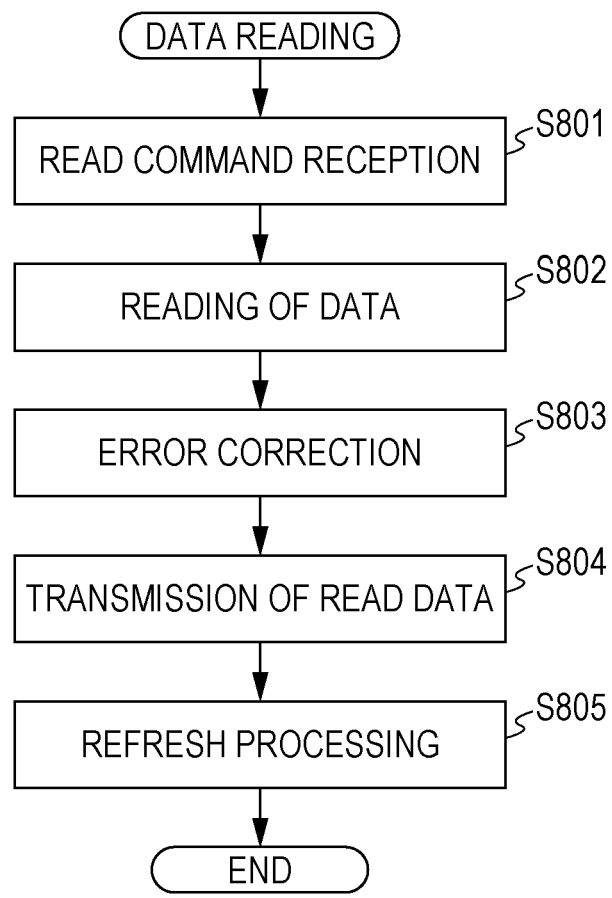
FIG. 8 is a flowchart illustrating operation during data reading in the nonvolatile memory apparatus.

Specific operation during data reading will be described with reference to FIG. 8. FIG. 8 is a flowchart illustrating operation of nonvolatile memory apparatus 101 during data reading.

When host apparatus 102 reads the content data from nonvolatile memory apparatus 101, host apparatus 102 transmits a read command and a read address to nonvolatile memory apparatus 101. In nonvolatile memory apparatus 101, host interface unit 111 in controller 103 receives the read command and the read address (S801).

After that, memory controller 112 determines a block and a read page of a read destination corresponding to the received read address with reference to logical-to-physical conversion table 116a, and reads the content data and the error correction code from the determined page of the block of the read destination (S802).

Then, error correction controller 113 performs error correction (restoring) of the content data read based on the error correction code read (S803).

Then, host interface unit 111 transmits the content data to which the error correction (restoring) is performed to host apparatus 102 (S804).

After the read data is transmitted to host apparatus 102 (S804), nonvolatile memory apparatus 101 performs refresh processing (S805).

In the refresh processing, the number of error bits is judged for a page other than the page read in the block from which the data is read, and the block is managed as the refresh target area when the number of error bits exceeds the threshold. After that, for one block in the block managed as the refresh target area, data of one page is copied to the other block for backup (hereinafter, referred to as "restoring block"). To perform error correction during the copying, the data in which the error is corrected is stored in the restoring block. After the data of all pages of the block managed as the refresh target area are copied to the restoring block, logical-to-physical conversion table 116a is rewritten, and the restoring block is newly associated with the logical address corresponding to the previous physical block managed as the refresh target area. The restoring block stores the data in which the error of the data of the physical block managed as the refresh target area is corrected. Thus, it is possible to reduce occurrence of a read error due to that the number of bit errors exceeds the error correction capability. Detailed operation of the refresh processing will be described with reference to FIG. 9.

First, error monitoring controller 114 selects an error monitoring page from pages in a read block, and reads the error monitoring page (S901). Specifically, error monitoring controller 114 selects one page from pages other than the read page in the read block as the error monitoring page, and reads the content data and error correction code of the selected page. The error monitoring page is randomly selected using random numbers for example.

Then, error correction controller 113 calculates the number of error bits of the content data read, and decides whether or not the number of error bits is equal to or greater than predetermined threshold T (S902). Threshold T is set to a value within a range of the number of error bits to which the error correction can be performed.

When the number of error bits is equal to or greater than threshold T, refresh controller 115 records a physical address corresponding to an address of the block read in refresh target area information 116b (S903).

Here, when the refresh information on the physical address corresponding to the address of the block read is already recorded as "valid" in refresh target area information 116b, it is not performed to newly record the physical address in refresh target area information 116b. That is, in refresh target area information 116b, it is not performed to update copy source block address 502 and copy destination block address 503.

On the other hand, when the refresh information on the physical address corresponding to the address of the block read is not recorded or is recorded as "invalid" in refresh target area information 116b, the refresh information on the physical address is newly added to refresh target area information 116b.

Specifically, the refresh information with the smallest value of sequence number 500 is selected among the refresh information in which status of use 501 is "invalid." Then, refresh controller 115 stores an address (physical address) of a physical block corresponding to the logical address of the read block in copy source block address 502 of the selected refresh information, and stores an address (physical address) of a new block (restoring block) to which write has not yet been performed in copy destination block address 503. Further, in number of copied pages 504, "0" is stored indicating that copying has not yet been performed, and status of use 501 is set to "valid."

As described above, the refresh information is newly added to refresh target area information 116b.

Then, for a block managed as the refresh target area in refresh target area information 116b, copy processing to the restoring block is executed.

Specifically, refresh controller 115 decides whether or not the entry exists of the refresh information in which the status of use is "valid", with reference to refresh target area information 116b (S904).

When the entry exists of the refresh information in which the status of use is "valid", the refresh information with the smallest sequence number 500 is selected as a processing target among the refresh information in which the status of use is "valid" (S905).

Refresh controller 115, for the selected refresh information, copies the data of one page in the block indicated by copy source block address 502 to the block (restoring block) indicated by copy destination block address 503 (S906), and thus the error bit is restored.

The page to be copied is determined based on a value indicated by number of copied pages 504. Specifically, as the page to be copied, the page is selected of a page number obtained by adding one to a value indicated by number of copied pages 504. Thus, refresh controller 115 copies page by page to the other block in the block including the number of error bits equal to or greater than the predetermined number. During copying, the content data and error correction code are read from a copy source page, and the error bit is restored by error correction controller 113, and the restored content data and error correction code are written in a copy destination page. Thus, it is possible to return the error bit to a state of being restored.

After that, refresh controller 115 updates the selected refresh information in refresh target area information 116b (S907). Specifically, a value of number of copied pages 504 is increased by one. At that time, when the value indicated by number of copied pages 504 matches with the number of pages (N) constituting one block, it means that copying of the data of the one block is completed. Therefore, when the value indicated by number of copied pages 504 matches with the number of pages (N) constituting one block, status of use 501 of the refresh information is changed to "invalid," and logical-to-physical conversion table 116a is updated. Specifically, in logical-to-physical conversion table 116a, for the logical address registered corresponding to the physical address indicated by copy source block address 502, the physical address corresponding to the logical address is rewritten from the physical address indicated by copy source block address 502 to the physical address indicated by copy destination block address 503. In addition, with the change to "invalid" of status of use 501 to one piece of the refresh information, when the other piece of the refresh information exists in which the status of use is "valid," sequence number 500 of each pieces of the refresh information is decreased by one.

As described above, during data read operation, nonvolatile memory apparatus 101 not only reads the data of the address designated by host apparatus 102 (S802), but also reads the data of an area (page) other than the address designated from host apparatus 102 to check the number of error bits (S901). Thus, it becomes possible to detect that the bit error is increased in pages other than the page to be read as illustrated in FIG. 7. Further, refresh controller 115 restores the error bit by copying the data to the other block for the block in which an increase in the error is detected. Thus, since restoring is possible before the number of errors exceeds the error correction capability for the error of the pages other than the page to be read as illustrated in FIG. 7, it is possible to prevent destruction of the data caused by reading repeatedly.

In addition, in read processing of the error monitoring page (S901), for reading from an area other than the address from which reading is instructed, reading of the data is limited to only one page. Thus, time required for the read processing is shortened, and degradation of read performance due to error monitoring read processing is reduced.

In addition, in the read processing of the error monitoring page (S901), a page to be read is selected with the random number. Therefore, when the page in which the error bit is increased varies in comparison with a manner for reading a particular page, it is possible to prevent detection failure of an error bit increase more effectively. In addition, since time for reading can be shortened in comparison with a manner for reading all pages, it is possible to improve read performance.

In addition, in recording to refresh target area information 116b (S903), sequence number 500 of the refresh information is numbered in order of recording, and in selection of the refresh target area (S905) and refresh copy processing (S906), the refresh processing is performed in order from the refresh information with a small sequence number 500 of the refresh information. Thus, it becomes possible to restore in order in which an increase of the number of error bits is detected. Thus, time is shortened from the detection of the increase of the number of error bits to restoring, and it is reduced that the restoring is too late and data destruction is caused.

In addition, in the refresh copy processing (S906), when the error is restored by copying, the number of pages to be copied in one read processing is limited to one page. Thus, since time required for copy processing can be shortened in comparison with a case in which one block is copied in one read processing for example, degradation of the read performance is reduced.

Figure 9:
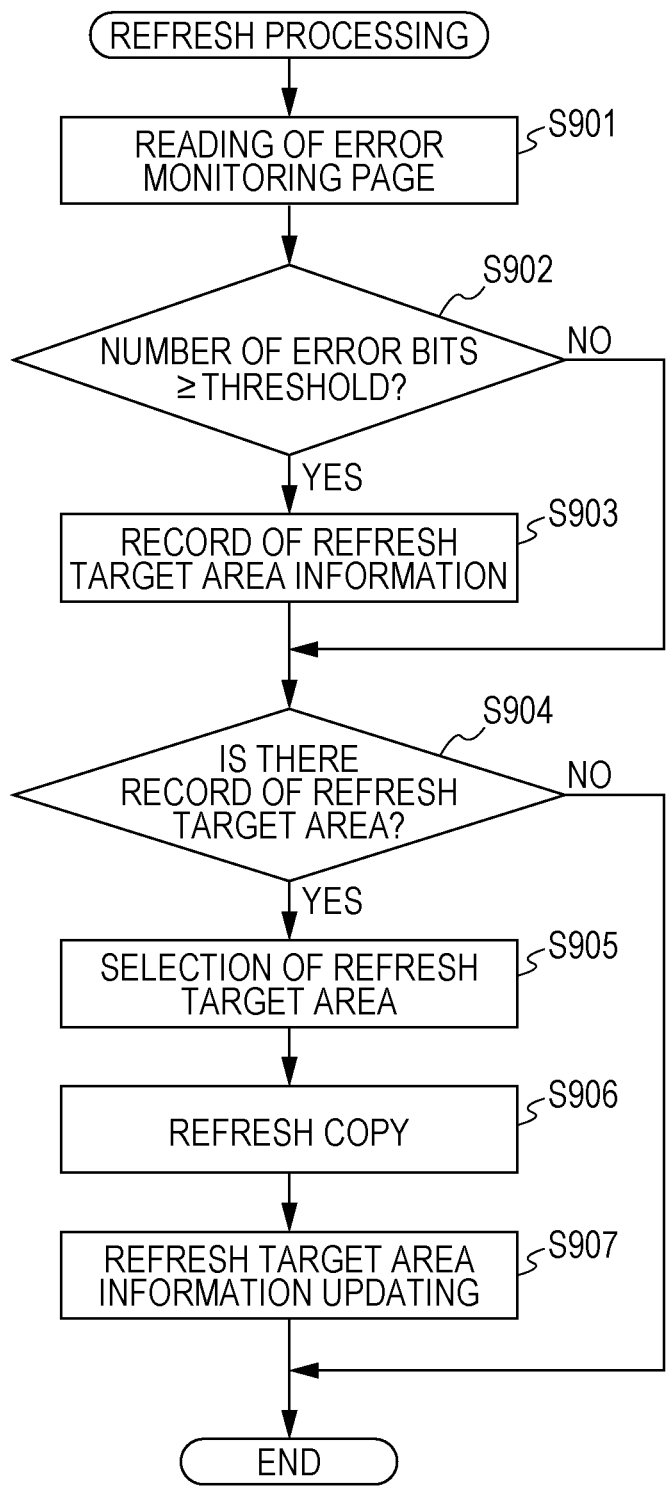
FIG. 9 is a flowchart illustrating operation of refresh processing in the nonvolatile memory apparatus.
Figure 10:
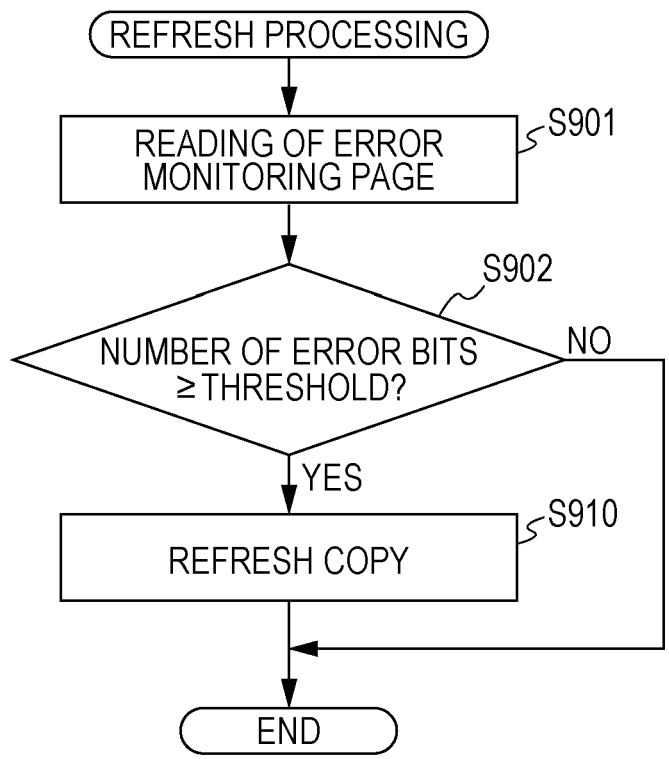
FIG. 10 is a flowchart illustrating an other operation example of the refresh processing in the nonvolatile memory apparatus.

Incidentally, in an example illustrated in FIG. 9, when the number of error bits is equal to or greater than the threshold in an error monitoring page, information of a block including the error monitoring page is only recorded in refresh target area information 116b once (S903), and the refresh copy (S906) is not immediately performed to the block. That is, in the example described above, even when it is detected that the number of error bits of the page is equal to or greater than the threshold, the data of the block including the page is then restored after a certain time. Reason for doing like this is to achieve shortening of time for read processing. However, in a situation such as length of processing time is not an issue in the read processing, when the number of error bits is equal to or greater than the threshold in the error monitoring page, the refresh copy (S906) can be immediately performed to the block including the error monitoring page. That is, as illustrated in FIG. 10, when the number of error bits is equal to or greater than the threshold in the error monitoring page (S902), entire data of the block (block from which the data is read) including the error monitoring page can be immediately copied to a new block (S910). At that time, rewriting of logical-to-physical conversion table 116a is also required. Thus, it is possible to quickly restore the data when the number of error bits of the page in the block is increased.

[1-3. Effects]

As described above, in the present exemplary embodiment, nonvolatile memory apparatus 101 is a nonvolatile memory apparatus for writing or reading data in response to a write or read request of the data from host apparatus 102 (one example of external apparatus). Nonvolatile memory apparatus 101 is provided with nonvolatile memory 104 including a plurality of blocks each being a recording area of the data and a unit of erasing of the data, and controller 103 for controlling writing or reading of the data to/from nonvolatile memory 104. Each of blocks 201 includes a plurality of pages 301 each being a unit of reading of the data. Controller 103, when reading data of page X in response to the data read request from host apparatus 102, reads data of an other page other than page X in a block from which the data is read, and calculates a number of errors of the data in the other page, and rewrites the data of the block into the other block when the block from which the data is read satisfies a predetermined condition on the error based on the calculated number of errors. Here, the predetermined condition on the error is a condition in which a frequency of occurrence of the bit error in the block (or page) is considered to be high, and, for example, includes that the number of error bits in one page is equal to or greater than the threshold, and a ratio of occurrence of the error bit in one page is equal to or greater than a predetermined value.

Incidentally, in the present disclosure, when the number of errors of the data of the other page is equal to or greater than a predetermined value, rewriting the data of the block to the other block includes both a case of rewriting at arbitrary timing after judging that the number of errors of the data of the other page is equal to or greater than the predetermined value as illustrated in FIG. 9, and a case of rewriting immediately after judging as illustrated in FIG. 10.

In read operation illustrated in FIG. 8 to FIG. 10, error monitoring controller 114 not only reads the data instructed to be read by host apparatus 102, but also reads an other monitoring page other than the block read to check the number of error bits. Thus, it becomes possible to detect that the error is increased of the pages other than the page to be read as illustrated in FIG. 7. Further, refresh controller 115 restores the error bit of the block in which it is detected that the error is increased. Thus, since restoring is possible before the number of errors exceeds the error correction capability for the error of the pages other than the page to be read, it is possible to prevent the destruction of the data caused by reading repeatedly.

Other Exemplary Embodiment

As described above, as an illustration of a technique disclosed in the present application, the first exemplary embodiment has been described. However, the technique of the present disclosure is not limited to the first exemplary embodiment, it is also possible to apply to an exemplary embodiment in which modification, replacement, addition, omission are appropriately performed. In addition, it is possible to make a new exemplary embodiment by combining elements described in the first exemplary embodiment. Therefore, another exemplary embodiment will be described below.

Although the read processing of the error monitoring page is performed every time during data reading in the first exemplary embodiment, it may not be performed every time. The read processing of the error monitoring page can be performed one time for every predetermined number of times of data reading. Thus, since processing time can be shortened, it is effective to be able to improve read performance. Otherwise, it can be determined with the random number whether or not read processing of the error monitoring page is performed. By doing this, it is possible to prevent detection failure of the error bit increase when a read address transmitted by host apparatus 102 is repeated at a certain period.

In the first exemplary embodiment, although the page to be read is one page in the read processing of the error monitoring page, a plurality of pages can be read. It is effective to be able to prevent the detection failure of the error bit increase. For example, in the read processing of the error monitoring page, in a same block as a block from which data is read, all pages other than the page from which the data is read can be read as the error monitoring page. At this time, the pages can be read in order from a head of the block, and also can be read in random order. In addition, when the all pages other than the page from which the data is read are read as the error monitoring page, if the number of error bits exceeds threshold T in at least one page of the pages read, the block can be recorded in refresh target area information 116b.

In the first exemplary embodiment, it is not judged whether or not the block is the refresh target area based on the page read in the read processing of the data. However, when the number of error bits is calculated also to the page read and the number of error bits is equal to or greater than the threshold, the block including the page can be recorded in refresh target area information 116b as the refresh target area. When host apparatus 102 simultaneously reads a plurality of pages, and when a nonvolatile memory is used in which the error bit of the page read is increased, it is effective to be able to prevent the detection failure of the error bit increase.

In the first exemplary embodiment, although one page is selected in the block in which reading is performed during read processing execution in the read processing of the error monitoring page, the page can be selected from a block other than the block from which the data is read. This is effective to a nonvolatile memory in which the error bit increase occurs of the block other than the block from which the data is read during data reading.

In the first exemplary embodiment, although refresh target area information 116b is stored by controller 103, refresh target area information 116b can be stored by nonvolatile memory 104. It is effective since restoring the block having many error bits can be continued even after power-on or power-off is performed.

In the first exemplary embodiment, although refresh processing is not performed during data writing, when a write address and the like is read from a nonvolatile memory during data writing, the refresh processing can be performed during data writing. It is possible to prevent destruction of the data caused by writing repeatedly.

In the first exemplary embodiment, as illustrated in FIG. 9, although the number of pages to be copied is one page in the refresh copy processing during data reading, a plurality of pages can be copied. Thus, it is effective to be able to restore the data of one block in a shorter time and to prevent that the restoring is too late and data destruction is caused. In addition, in refresh target area information 116b, the number of pages to be copied can be increased in the refresh copy processing only when a number of pieces of the refresh information in which status of use is "invalid" is equal to or less than a predetermined value. It is effective to be able to prevent detection failure of the error bit increase without degrading read performance. In addition, when an issuance frequency is low of write and read commands transmitted from host apparatus 102, the number of pages to be copied can be increased in the refresh copy processing. It is effective to be able to prevent detection failure of the error bit increase without degrading read performance. In addition, when the number of error bits of the page read is equal to or greater than second threshold U higher than threshold T in the read processing of the error monitoring page, the number of pages to be copied can be increased in the refresh copy processing. Thus, it is effective to be able to prevent that the restoring is too late and data destruction is caused. In addition, when a number of times of rewriting in nonvolatile memory 104 is increased and the error bit increase occurs in a smaller number of times of reading, the number of pages to be copied can be increased in the refresh copy processing. It is effective to be able to prevent that the restoring is too late and data destruction is caused.

In the present exemplary embodiment, in reading of the error monitoring page, although the refresh processing is performed preferentially to the refresh information having a smaller sequence number of the refresh information, not limited to this order, the refresh processing can be performed preferentially to the refresh information having a large number of error bits. It is effective to be able to prevent that the restoring is too late and data destruction is caused.

In the present exemplary embodiment, in the read processing of the error monitoring page, although the page to be read is selected with the random number, decision can be made whether or not the selected page is the refresh target area, by selecting the page in order from the one having a smaller page number, without using the random number. Thus, it is effective to be able to prevent the detection failure of the error bit. In addition, when a page in which the error bit is likely to occur in the block exists, only the page can be read. Otherwise, when the page in which the error bit is likely to occur exists, the page can be selected using the weighted random number so that the page is easily selected. This is effective to be able to detect the error bit increase efficiently.

In the present exemplary embodiment, in the refresh copy processing, although copying is performed in order from the page having a smaller page number, the copying can be performed in order from the page in which it is detected that the error bit is equal to or greater than threshold T. Since it is possible to shorten time to restore the page in which the error bit is increased, it is effective to be able to prevent that the restoring is too late and data destruction is caused.

As described above, the exemplary embodiments have been described as illustrations of technique of the present disclosure. For that purpose, accompanying drawings and detailed description has been provided.

Accordingly, in the elements described in the accompanying drawings and the detailed description, there may be included not only essential elements for solving problems but also non-essential elements for solving the problems, to illustrate the above technique. Therefore, it should not be certified that those non-essential elements are essential immediately, with that those non-essential elements are described in the accompanying drawings and the detailed description.

In addition, since the above described exemplary embodiments are intended to illustrate the technique of the present disclosure, it is possible to perform various modifications, substitutions, additions, omissions and the like within the scope of the claims or the scope of the equivalents of the claims.

The present disclosure can be applied to a recording apparatus incorporating a nonvolatile memory in which an error bit increase is caused by reading. Specifically, the present disclosure can be applied to a memory card, flash drive, embedded memory device, SSD (Solid State Drive), and the like.

What is claimed is:

1. A nonvolatile memory apparatus for writing or reading data in response to a write or read request of the data from an external apparatus, the nonvolatile memory apparatus comprising:

a nonvolatile memory including a plurality of blocks each being a recording area of the data and a unit of erasing of the data; and
 a controller for controlling writing or reading of the data to/from the nonvolatile memory,
 wherein each of the blocks includes a plurality of pages each being a unit of reading of the data, and
 the controller, when data of a first page is read in response to the data read request from the external apparatus, reads data of an other page other than the first page in a block from which the data is read, and
 calculates a number of errors of the data in the other page, and
 rewrites the data of the block into the other block when the block from which the data is read satisfies a predetermined condition on the error based on the calculated number of errors.

2. The nonvolatile memory apparatus according to claim 1, wherein the controller reads at least one page other than the first page being in a same block, as the other page other than the first page.

3. The nonvolatile memory apparatus according to claim 2, wherein the controller randomly selects the at least one page.

4. The nonvolatile memory apparatus according to claim 1, wherein the controller reads all pages other than the first page in the same block, as the other page other than the first page.

5. The nonvolatile memory apparatus according to claim 4, wherein the controller reads the page in order from a head of the block during reading of the all pages other than the first page.

6. The nonvolatile memory apparatus according to claim 4, wherein the controller reads each of the all pages other than the first page in random order.

7. The nonvolatile memory apparatus according to claim 1, wherein the predetermined condition is that the calculated number of errors is equal to or greater than a predetermined threshold.

8. A control method of a nonvolatile memory apparatus for writing or reading data in response to a write or read request of the data from an external apparatus, the nonvolatile memory apparatus including a plurality of blocks each being a recording area of the data and a unit of erasing of the data, each of the blocks including a plurality of pages each being a unit of reading of the data, the control method of the nonvolatile memory apparatus comprising:

reading data of a first page in response to the data read request from the external apparatus;
 reading data of an other page other than the first page in a block from which the data is read;
 calculating a number of errors of the data in the other page; and
 rewriting the data of the block into the other block when the block from which the data is read satisfies a predetermined condition on the error based on the calculated number of errors.

* * * * *